(12) United States Patent
Jang et al.

(10) Patent No.: US 6,387,788 B2
(45) Date of Patent: *May 14, 2002

(54) METHOD FOR FORMING POLYCIDE GATE ELECTRODE OF METAL OXIDE SEMICONDUCTOR FIELD EFFECT TRANSISTOR

(75) Inventors: Se Aug Jang; In Seok Yeo, both of Ichon (KR)

(73) Assignee: Hyundai Electronics Industries Co., Ltd. (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/343,171

(22) Filed: Jun. 29, 1999

(30) Foreign Application Priority Data

Jun. 29, 1998 (KR) ............................................. 98-24654

(51) Int. Cl.[7] ..................... H01L 21/336; H01L 21/265; H01L 21/3205; H01L 21/44
(52) U.S. Cl. ..................... 438/592; 438/653; 438/664; 438/302; 438/520; 438/926; 438/280
(58) Field of Search ................................. 438/592, 653, 438/664, 520, 279, 280, 281, 282–302, 586, 683, 655, 656, 567, 533, 926, 238, 597, 631, 633

(56) References Cited

U.S. PATENT DOCUMENTS

| | | | |
|---|---|---|---|
| 4,804,636 A | | 2/1989 | Groover, III et al. |
| 4,931,411 A | | 6/1990 | Tigelaar et al. |
| 4,975,756 A | | 12/1990 | Haken et al. |
| 5,010,032 A | | 4/1991 | Tang et al. |
| 5,285,102 A | * | 2/1994 | Ying ........................... 257/638 |
| 5,441,914 A | * | 8/1995 | Taft .............................. 437/189 |
| 5,525,529 A | * | 6/1996 | Guldi ........................... 438/565 |
| 5,597,745 A | * | 1/1997 | Byun ............................ 437/41 |
| 5,656,546 A | | 8/1997 | Chen et al. |
| 5,731,232 A | | 3/1998 | Wuu et al. |
| 5,744,395 A | | 4/1998 | Shue et al. |
| 5,998,247 A | * | 12/1999 | Wu ............................... 438/200 |
| 6,022,795 A | * | 2/2000 | Chen ............................ 438/586 |
| 6,063,692 A | * | 5/2000 | Lee et al. ..................... 438/431 |
| 6,074,938 A | * | 6/2000 | Asamura ...................... 438/533 |
| 6,074,956 A | * | 6/2000 | Yang ............................ 438/721 |
| 6,103,606 A | * | 8/2000 | Wu ............................... 438/586 |
| 6,171,981 B1 | * | 1/2001 | Byun ............................ 438/785 |
| 6,190,933 B1 | * | 2/2001 | Shimabukuro et al. ........ 438/30 |
| 6,200,871 B1 | * | 3/2001 | Moslehi ....................... 438/303 |

(List continued on next page.)

FOREIGN PATENT DOCUMENTS

| | | | | |
|---|---|---|---|---|
| DE | 003131875 A1 | * | 3/1982 | |
| GB | 2061615 A | * | 5/1981 | |
| GB | 2077993 A | * | 12/1981 | |
| JP | 64-25571 | | 1/1989 | ........... H01L/29/78 |
| JP | 64-25572 | | 1/1989 | ........... H01L/29/78 |
| JP | 404360525 A | * | 12/1992 | |
| JP | 405067628 A | * | 3/1993 | |
| JP | 405259154 A | * | 10/1993 | |
| JP | 6-45352 | | 2/1994 | ......... H01L/21/336 |
| JP | 406104428 A | * | 4/1994 | |
| JP | 6-275559 | | 9/1994 | ........... H01L/21/28 |

*Primary Examiner*—Matthew Smith
*Assistant Examiner*—Chuong A Luu
(74) *Attorney, Agent, or Firm*—Blakely Sokoloff Taylor & Zafman

(57) ABSTRACT

The present invention provides a method for fabricating an improved gate electrode of a MOSFET device. And the method for fabricating a MOSFET device having a polycide gate to which a titanium silicide is applied comprises the steps of sequentially forming a polysilicon layer on a gate insulating layer and a titanium layer in this order, forming a capping layer on the titanium layer and forming a titanium silicide layer by performing a rapid thermal process in nitrogen atmosphere.

5 Claims, 7 Drawing Sheets

U.S. PATENT DOCUMENTS 6,255,163 B1 * 7/2001 Zatelli et al. ................ 438/257
6,284,634 B1 * 9/2001 Rha ............................ 438/592
6,284,638 B1 * 9/2001 Itano .......................... 438/596
6,294,434 B1 * 9/2001 Tseng ......................... 438/303
6,306,758 B1 * 10/2001 Park ........................... 438/636
6,316,333 B1 * 11/2001 Bruel et al. ................. 438/458

* cited by examiner

METHOD FOR FORMING POLYCIDE GATE ELECTRODE OF METAL OXIDE SEMICONDUCTOR FIELD EFFECT TRANSISTOR

FIELD OF THE INVENTION

The present invention relates to a method for fabricating a semiconductor and, more particularly, to a method for fabricating a metal oxide semiconductor field effect transistor (MOSFET) having a polycide gate electrode.

DESCRIPTION OF THE PRIOR ART

In the prior art, a polycide, which is stacked with a polysilicon or a tungsten-silicide/polysilicon, has been used as a gate electrode of metal oxide semiconductor field effect transistor (MOSFET). However, as the density of semiconductor devices increases, a line width of gate electrode becomes narrower. So conventional electrode materials may not satisfy low resistance required in high-integrated devices. Accordingly, silicide-type materials such as $TiSi_2$, $CoSi_2$, $VSi_2$, $ZrSi_2$, $NbSi_2$, $MoSi_2$ and $HfSi_2$ have been developed as a substitution for single polysilicon materials. As of now, titanium silicide ($TiSi_2$) relatively well satisfies requirements for the gate electrode such as a low resistivity, a high melting point, an easiness of forming a thin layer and a line pattern, a thermal stability and so on. So, the titanium silicide ($TiSi_2$) is considered to be remarkable.

FIGS. 1A to 1F are cross-sectional views illustrating a conventional MOSFET to which a titanium silicide is applied.

First, a gate oxide layer 2 is grown on a substrate 1 and a polysilicon layer 3 having a low resistivity is deposited on the gate oxide layer 2 by using the LPCVD (low-pressure chemical vapor deposition) method, and then a titanium layer 4 is deposited on the polysilicon layer 3, as shown in FIG. 1A.

Next, by performing a RTP (rapid thermal process) for a few seconds, in a nitrogen atmosphere and at a specific temperature, a titanium silicide layer 5 having a low resistivity is formed by a reaction between the titanium layer 4 and the polysilicon layer 3, as shown in FIG. 1B.

A mask oxide layer 6 is deposited on the titanium silicide layer 5, so that the titanium silicide layer 5 may be protected when sidewall spacers are formed by a following dry-etching process, as shown in FIG. 1C.

Subsequently, a gate electrode is patterned by applying mask and etching processes to the mask oxide layer 6, the titanium silicide layer 5, the polysilicon layer 3 and the gate oxide layer 2, as shown in FIG. 1D.

A screen oxide layer 7 is grown on the exposed substrate 1 by a thermal process, so that it may protect a damage to the substrate 1 when a source/drain region is formed by ion implantation, as shown in FIG. 1E.

Finally, the lightly doped source/drain region 8 is formed by a low-density ion implantation, as shown in FIG. 1F. Next, after forming sidewall spacers on the sidewall of gate, a heavily doped drain/source region is formed by a high-density ion implantation after the formation of a LDD (lightly doped drain) structure.

FIGS. 2A to 2C are cross-sectional views showing problems caused by the prior art. Referring to FIG. 2A, a titanium nitride layer 9, which is undesirable, is formed between the titanium silicide layer 5 and the mask oxide layer 6. The reason for the formation of the titanium nitride layer 9 is that the RTP (rapid thermal process) shown in FIG. 1B is performed in a nitrogen atmosphere. That is, the titanium nitride layer 9 is easily formed since titanium easily reacts with nitrogen. FIG. 2B shows another problem caused by the formation of the titanium nitride layer 9 shown in FIG. 2A. That is, when the screen oxide layer 7 is grown, the sidewalls of the gate electrode structure, which include a polysilicon/titanium-silicide, as well as the substrate 1 are simultaneously oxidized, thereby forming an abnormal oxide layer. At this time, since the titanium nitride layer 9 is very easily oxidized, a thick oxide layer 10, which is abnormally grown, is formed on the side of the titanium nitride layer 9. In particular, the LDD (lightly doped drain) region may have an abnormal ion-implantation profile since the thick oxide layer 10 acts as a barrier in performing the ion implantation, as shown in FIG. 2C.

SUMMARY OF THE INVENTION

It is, therefore, an object of the present invention to provide a method for fabricating an improved gate electrode of a MOSFET device.

In accordance with an aspect of the present invention, there is provided a method for fabricating a MOSFET device having a polycide gate to which a titanium silicide is applied, comprising the steps of sequentially forming a polysilicon layer on a gate insulating layer and a titanium layer in this order, forming a capping layer on the titanium layer and forming a titanium silicide layer by performing a rapid thermal process in nitrogen environment

BRIEF DESCRIPTION OF THE DRAWINGS

The above and other objects and features of the present invention will become apparent from the following description of the preferred embodiments given in connection with the accompanying drawings, in which.

DETAILED DESCRIPTION OF THE PREFERRED EMBODIMENTS

Hereinafter, the present invention will be described in detail referring to the accompanying drawings.

A method for fabricating an improved gate electrode of a MOSFET device comprises the steps of forming a polysilicon layer and a titanium layer on a gate insulating layer, forming a capping layer on the titanium layer in order to prevent a titanium nitride layer from being generated on a titanium silicide layer during a rapid thermal process and performing a rapid thermal process in a nitrogen atmosphere to form the titanium silicide layer.

Figure 3A:
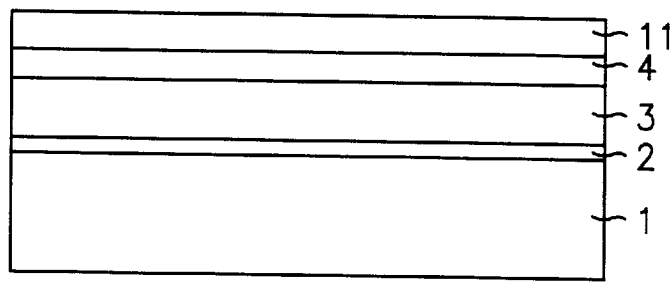
FIGS. 3A to 3E are cross-sectional views illustrating a MOSFET device according to an embodiment of the present invention.
Figure 3B:
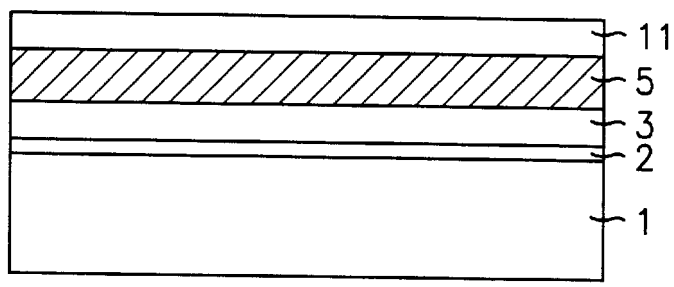

FIGS. 3A to 3B are cross-sectional views illustrating a MOSFET device according to an embodiment of the present invention. As shown in FIG. 3A, after growing a gate oxide layer 2 on a substrate 1, a polysilicon layer 3 having a low resistivity is deposited to a thickness of 1000~2000 Å by a low-pressure chemical vapor deposition (LPCVD). A titanium layer 4 is then deposited to a thickness of 200~1000 Å on the polysilicon layer 3. Then, an oxide layer 11 is deposited to a thickness of 500~1500 Å to cap a surface of the exposed titanium layer 4. The capping of the titanium layer 4 prevents a titanium nitride layer from being generated on the titanium silicide layer during a subsequent rapid thermal process (RTP).

Next, by performing a rapid thermal process (RTP) in nitrogen atmosphere, the titanium silicide layer 5 is formed by a reaction between the titanium layer 4 and the polysilicon layer 3, as shown in FIG. 3B. At this time, even if the rapid thermal process (RTP) is performed in nitrogen atmosphere, the titanium nitride layer, which is undesirable, is not formed because the oxide layer 11 is capping the surface of the titanium layer 4 and then prevents nitrogen in a nitrogen atmosphere from reacting on the titanium layer 4. When sidewall spacers are formed in subsequent process, the oxide layer 11 may also be used as a mask oxide layer protecting the gate electrode. Meanwhile, the rapid thermal process (RTP) can be performed at a temperature of 800~850° C. for 10~30 seconds. In addition, it is possible to perform the rapid thermal process (RTP) in two separate steps in order to effectively form C54 phase having a very low resistivity. The first rapid thermal process (RTP) is performed at a temperature of 700~750° C. for 10~30 seconds and the second rapid thermal process (RTP) is performed at a temperature of 750~850° C. for 10~30 seconds.

Figure 3C:
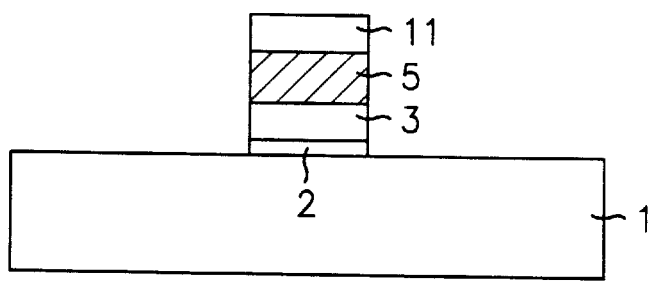

Subsequently, by performing mask and etching processes, a gate electrode (or polycide gate) is patterned as shown in FIG. 3C.

Figure 3D:
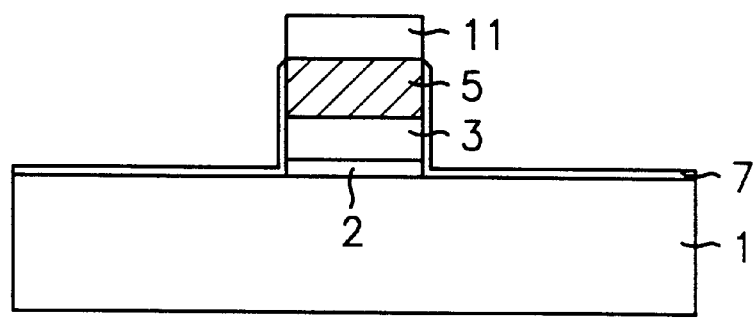

And then, a screen oxide layer 7 is grown on the exposed substrate 1 by a thermal process, as shown in FIG. 3D. Here, since a titanium nitride layer does not exist, the screen oxide layer 7 is in uniformity on the sidewalls of the polycide gate. At this time, the screen oxide layer 7 is formed to a thickness of 30~100 Å at a temperature of 700~850° C. If the temperature becomes more than 850° C., an agglomeration may occur on the titanium silicide layer 5 and its resistivity may suddenly increase.

Figure 1A:
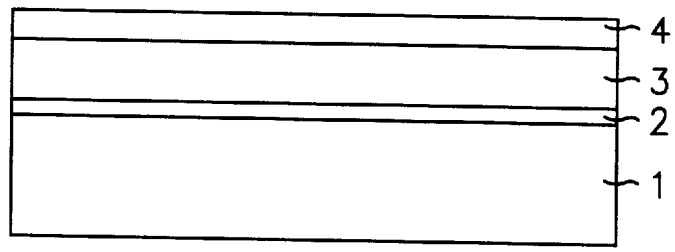
FIGS. 1A to 1F are cross-sectional views illustrating a conventional MOSFET device.
Figure 1B:
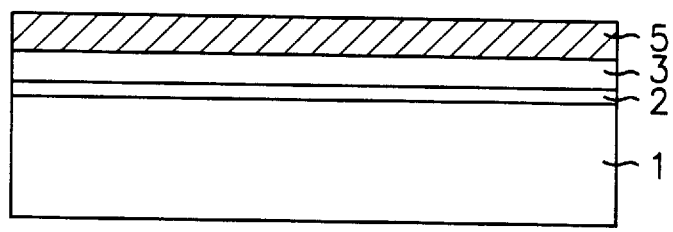
Figure 1C:
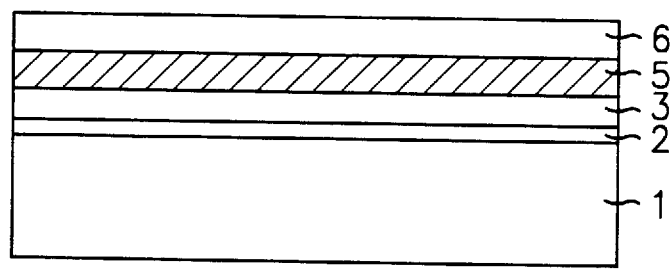
Figure 1D:
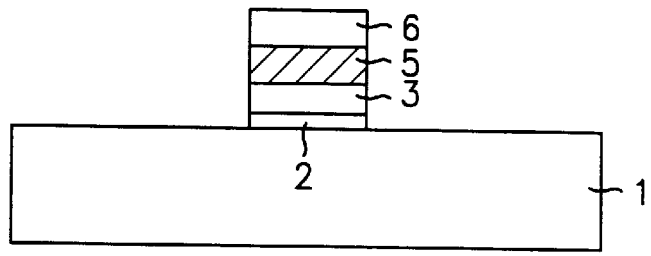
Figure 1E:
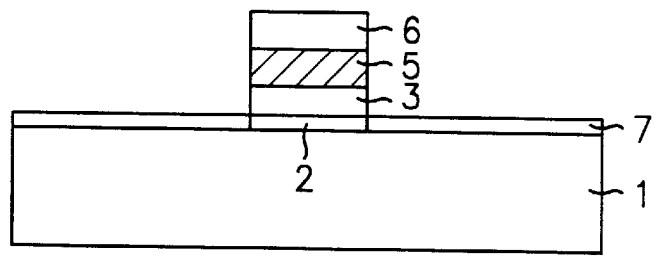
Figure 1F:
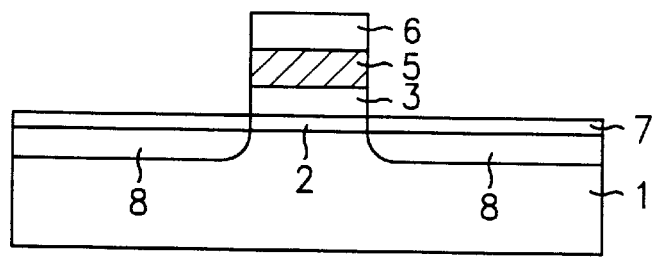
Figure 2A:
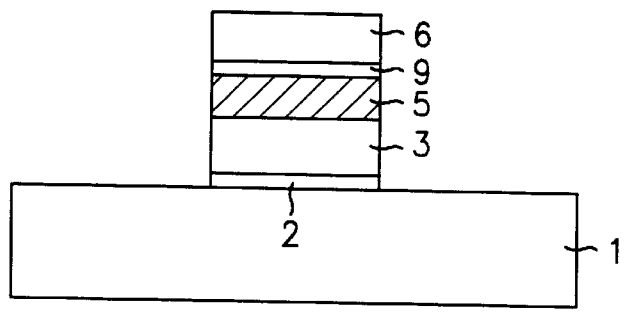
FIGS. 2A to 2C are cross-sectional views showing a problem caused by the prior art in FIGS. 1A to 1F.
Figure 2B:
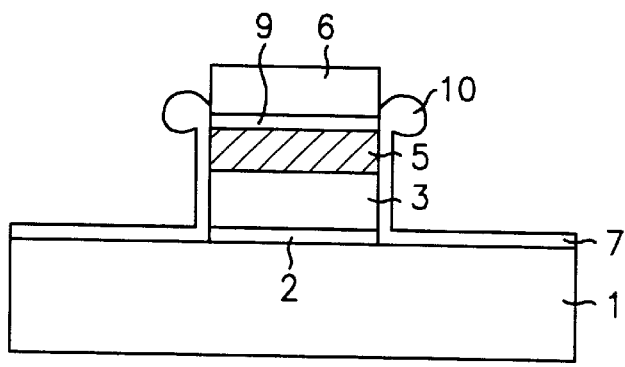
Figure 2C:
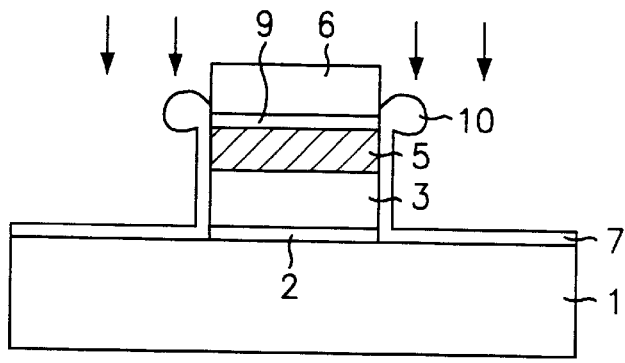
Figure 3E:
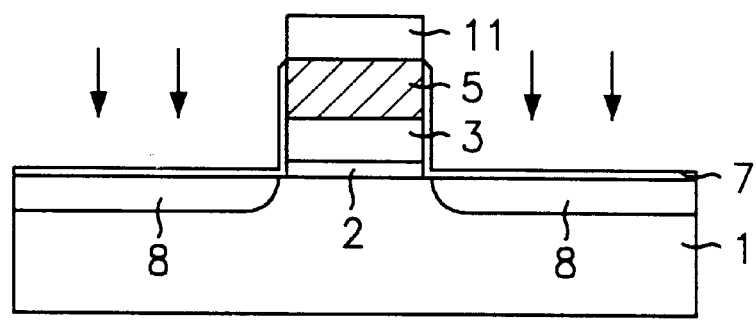

Finally, a source/drain region 8 having a LDD (lightly doped drain) structure are formed by performing a low-density ion implantation, as shown in FIG. 3E. Here, since an abnormal oxide layer (10 in FIG. 2C) is not formed on the sidewalls of the polycide gate compared to the prior art, the low-density ion implantation is not interrupted so that the LDD (lightly doped drain) structure can normally be formed.

Figure 4A:
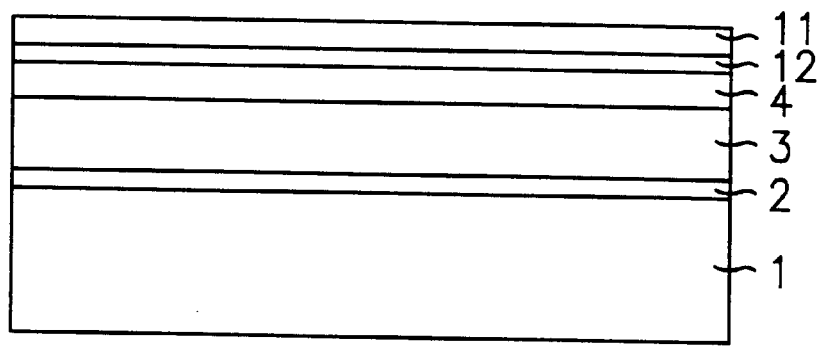
FIGS. 4A to 4B are cross-sectional views illustrating a MOSFET device according to another embodiment of the present invention.
Figure 4B:
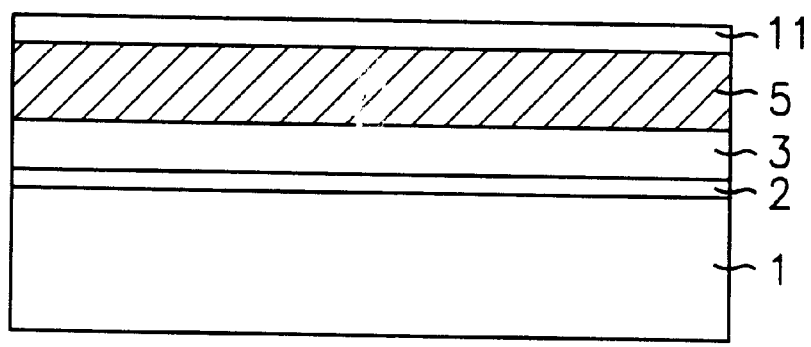

FIGS. 4A to 4B are cross-sectional views illustrating a MOSFET device according to an another embodiment of the present invention. As shown in FIG. 4A, after growing a gate oxide layer 2 on a substrate 1, a polysilicon layer 3 having a low resistivity is deposited to a thickness of 1000~2000 Å by a low-pressure chemical vapor deposition (LPCVD). A titanium layer 4 is then deposited to a thickness of 200~1000 Å on the polysilicon layer 3. And then, a ploysilicon layer or an amorphous silicon layer 12 is deposited to a thickness of 100~500 Å to cap a surface of the exposed titanium layer 4 and then an oxidelayer 11 is further deposited. The capping of the titanium layer 4 prevents a titanium nitride layer from being generated on the titanium silicide layer during a following rapid thermal process (RTP).

Next, by performing a rapid thermal process (RTP) in nitrogen atmosphere, the titanium silicide layer 5 is formed by a reaction between the titanium layer 4 and the polysilicon layer 3, as shown in FIG. 4B. At this time, even if the rapid thermal process (RTP) is performed in nitrogen atmosphere, the titanium nitride layer, which is undesirable, is not formed because the oxide layer 11 is capping the surface of the titanium layer 4. When sidewall spacers are formed in subsequent process, the oxide layer 11 may also be used as a mask oxide layer protecting the gate electrode. Meanwhile, the rapid thermal process (RTP) can be performed at a temperature of 800~850° C. for 10~30 seconds. In addition, it is possible to perform the rapid thermal process (RTP) in two separate steps in order to effectively form C54 phase having a very low resistivity. The first rapid thermal process (RTP) is performed at a temperature of 700~750° C. for 10~30 seconds and the second rapid thermal process (RTP) is performed at a temperature of 750~850° C. for 10~30 seconds. The processing steps above described in FIGS. 3C to 3E can be applied to a subsequent process.

Figure 5A:
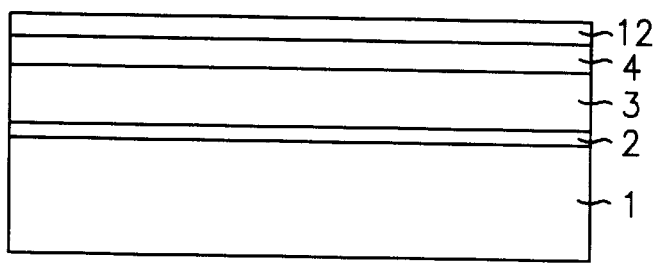
FIGS. 5A to 5C are cross-sectional views illustrating a MOSFET device according to a further another embodiment of the present invention.

FIGS. 5A to 3C are cross-sectional views illustrating a MOSFET device according to a further another embodiment of the present invention.

As shown in FIG. 5A, after growing a gate oxide layer 2 on a substrate 1, a polysilicon layer 3 having a low resistivity is deposited to a thickness of 1000~2000 Å by a low-pressure chemical vapor deposition (LPCVD). A titanium layer 4 is then deposited to a thickness of 200~1000 Å on the polysilicon layer 3. Then, a polysilicon layer or an armorphous silicon layer 12 is deposited to a thickness of 100~500 Å to cap a surface of the exposed titanium layer 4. The capping of the titanium layer 4 prevents a titanium nitride layer from being generated on the titanium silicide layer during a following rapid thermal process (RTP).

Figure 5B:
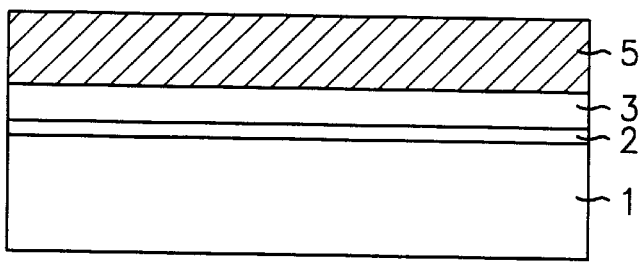

Next, by performing a rapid thermal process (RTP) in nitrogen atmosphere, the titanium silicide layer 5 is formed by a reaction between the titanium layer 4 and the polysilicon layer 3, as shown in FIG. 5B. At this time, even if the rapid thermal process (RTP) is performed in nitrogen atmosphere, the titanium nitride layer, which is undesirable, is not formed because the polysilicon or amorphous silicon layer 12 is capping the surface of the titanium layer 4. In the same manner, the rapid thermal process (RTP) can be performed at a temperature of 800~850° C. for 10~30 seconds. In addition, it is possible to perform the rapid thermal process (RTP) in two separate steps in order to effectively form C54 phase having a very low resistivity. The first rapid thermal process (RTP) is performed at a temperature of 700~750° C. for 10~30 seconds and the second rapid thermal process (RTP) is performed at a temperature of 750~850° C. for 10~30 seconds. At this time, during the RTP process, the polysilicon or amorphous silicon layer 12 prevents nitrogen from reacting on the titanium layer 4.

Figure 5C:
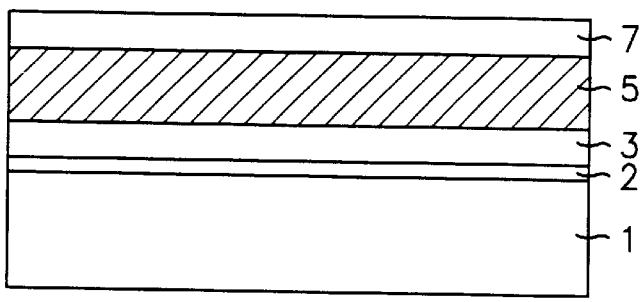

Subsequently, as shown in FIG. 5C, a mask oxide layer 7 is deposited in order to protect the gate, i.e., the titanium silicide layer 5 when sidewall spacers are formed in subsequent process.

In the same manner of the prior art, a gate electrode is patterned by performing a mask and etching process, and then a screen oxide layer is grown. A source/drain region 8 having a LDD (lightly doped drain) structure is formed by performing a low-density ion implantation.

As a result, by preventing an abnormal growth of an oxide layer on sidewalls of polycide gate to which a titanium silicide is applied, a MOSFET device according to the present invention may have good characteristics of semiconductor device and improve the yield.

While the present invention has been described with respect to certain preferred embodiments only, other modifications and variation may be made without departing from the spirit and scope of the present invention as set forth in the following claims.

What is claimed is:

1. A method for fabricating a MOSFET device having a polycide gate to which a titanium silicide is applied, comprising the steps of:

forming a gate insulating layer on a semiconductor substrate;

forming a polysilicon layer on the gate insulating layer;

forming a titanium layer on the polysilicon layer;

forming a nitrogen blocking layer on the titanium layer to prevent a formation of a titanium nitride layer where the nitrogen blocking layer prevents nitrogen in a nitrogen atmosphere form reacting on the titanium layer during a rapid thermal process, wherein the blocking layer is formed with a layer selected from a group consisting of a polysilicon layer, an amorphous layer and an oxide layer;

forming a titanium silicide layer under the nitrogen blocking layer by performing a rapid thermal process in the nitrogen atmosphere;

forming a mask insulating layer on the nitrogen blocking layer;

pattering the nitrogen blocking layer, the titanium silicide layer, the polysilicon layer and the gate insulating layer by using the mask insulating layer and etching process, whereby the surface of the semiconductor substrate and sidewalls of the nitrogen blocking layer, the titanium silicide layer, the polysilicon layer and the gate insulating layer are exposed; and performing an oxidation process for forming a screen oxide layer on the exposed surface of the semiconductor substrate and the exposed sidewalls of the nitrogen blocking layer, titanium silicide layer, the polysilicon layer and the gate insulating layer.

2. The method as recited in claim 1, wherein the rapid thermal process comprises: a first rapid thermal process performed at a temperature of 700 to 750° C. for 10 to 30 seconds and a second rapid thermal process performed at a temperature of 750 to 850° C. for 10 to 30 seconds.

3. The method as recited in claim 1 wherein the rapid thermal process is performed at a temperature of 800 to 850° C. for 10 to 30 seconds.

4. The method as recited in claim 1, wherein the rapid thermal process comprises: a first rapid thermal process performed at a temperature of 700 to 750° C. for 10 to 30 seconds and a second rapid thermal process performed at a temperature of 750 to 850° C. for 10 to 30 seconds.

5. The method as recited in claim 1, wherein the screen oxide layer is grown to a thickness of 30 to 100 Å at a temperature of 700 to 850° C.

* * * * *